(12) United States Patent
Mochizuki

(10) Patent No.: US 10,134,460 B2
(45) Date of Patent: Nov. 20, 2018

(54) SKYRMION GENERATION DEVICE, SKYRMION GENERATION METHOD, AND MAGNETIC MEMORY DEVICE

(71) Applicant: JAPAN SCIENCE AND TECHNOLOGY AGENCY, Kawaguchi-shi, Saitama (JP)

(72) Inventor: Masahito Mochizuki, Tokyo (JP)

(73) Assignee: JAPAN SCIENCE AND TECHNOLOGY AGENCY, Kawaguchi-shi, Saitama (JP)

( * ) Notice: Subject to any disclaimer, the term of this patent is extended or adjusted under 35 U.S.C. 154(b) by 0 days.

(21) Appl. No.: 15/558,630

(22) PCT Filed: Mar. 8, 2016

(86) PCT No.: PCT/JP2016/057073
§ 371 (c)(1),
(2) Date: Sep. 15, 2017

(87) PCT Pub. No.: WO2016/158230
PCT Pub. Date: Oct. 6, 2016

(65) Prior Publication Data
US 2018/0090195 A1    Mar. 29, 2018

(30) Foreign Application Priority Data

Mar. 31, 2015   (JP) ................. 2015-072079

(51) Int. Cl.
*G11C 11/00* (2006.01)
*G11C 11/16* (2006.01)
(Continued)

(52) U.S. Cl.
CPC ............ *G11C 11/1675* (2013.01); *G11B 5/02* (2013.01); *G11B 5/65* (2013.01); *G11C 11/161* (2013.01);
(Continued)

(58) Field of Classification Search
CPC ...... G11C 11/1675; G11C 11/16; G11C 19/08; G11C 19/0866; G11C 11/161;
(Continued)

(56) References Cited

U.S. PATENT DOCUMENTS

2016/0314827 A1* 10/2016 Cros .................. G11C 11/16
2017/0178747 A1*  6/2017 Tokunaga .......... G11C 19/0841

FOREIGN PATENT DOCUMENTS

CN        104347226 A      2/2015
JP        H07-302886 A    11/1995
(Continued)

OTHER PUBLICATIONS

X. Z. Yu et al., "Skyrmion flow near room temperature in an ultralow current density", Nature Communications, 3, Article No. 988, pp. 1-6 (2012).
(Continued)

*Primary Examiner* — Thong Q Le
(74) *Attorney, Agent, or Firm* — Amster, Rothstein & Ebenstein LLP

(57) ABSTRACT

A skyrmion generation method capable of reducing power consumption in generating skyrmions is provided. In the skyrmion generation method, an electric field is applied to an insulating magnetic body having a chiral crystal structure locally using an electric field generation unit while a magnetic field is applied from a magnetic field generation unit to the magnetic body. As a result, a skyrmion is generated in the magnetic body. The magnetic body preferably has a thin film shape with a thickness in a range of 2 to 300 nm at least partially, and the magnetic field generation unit preferably applies the magnetic field to a surface of the magnetic body substantially perpendicularly.

20 Claims, 13 Drawing Sheets

(51) Int. Cl.
- *G11B 5/02* (2006.01)
- *G11B 5/65* (2006.01)
- *H01L 43/08* (2006.01)
- *G11C 11/18* (2006.01)
- *H01L 27/22* (2006.01)
- *H01L 43/06* (2006.01)
- *H01L 43/10* (2006.01)

(52) U.S. Cl.
CPC ............ *G11C 11/18* (2013.01); *H01L 27/222* (2013.01); *H01L 43/06* (2013.01); *H01L 43/08* (2013.01); *H01L 43/10* (2013.01)

(58) Field of Classification Search
CPC . G11C 11/1673; G11C 11/18; G11C 19/0841; G11C 19/085; G11C 11/5607; G11C 11/1693; G11C 19/0808
USPC ...................................................... 365/1, 8, 7
See application file for complete search history.

(56) References Cited

FOREIGN PATENT DOCUMENTS

| JP | 2002-343943 A | 11/2002 |
|----|---------------|---------|
| JP | 2003-204095 A | 7/2003 |
| JP | 2009-508353 A | 2/2009 |
| JP | 2014-078560 A | 5/2014 |
| JP | 2014-086470 A | 5/2014 |
| JP | 2014-175417 A | 9/2014 |
| JP | 2016-139673 A | 8/2016 |
| WO | 1999/050833 A1 | 10/1999 |
| WO | 2015/015007 A1 | 2/2015 |

OTHER PUBLICATIONS

Junichi Iwasaki et al., "Current-induced skyrmion dynamics in constricted geometries", Nature Nanotechnology, vol. 8, pp. 742-747 (2013).

Yoshinori Tokura et al., "Research Frontier Skyrmions—Opening Doors to New Electromagnetics", Riken News, No. 404, pp. 2-13 (Feb. 2015).

Masahito Mochizuki, "How to Write, Delete, and Drive Skyrmions", The Magnetics Society of Japan, vol. 10, No. 4, pp. 192-198 (2015).

International Search Report received for PCT Patent Application No. PCT/JP2016/057073, dated May 31, 2016, 2 pages.

The International Bureau of WIPO, "International Preliminary Report on Patentability," issued in International Application No. PCT/JP2016/057073, of which U.S. Appl. No. 15/558,630 is a U.S. national phase entry, dated Oct. 12, 2017, 6 pages.

J. S. White et al., "Electric field control of the skyrmion lattice in Cu2OSeO3," Journal of Physics: Condensed Matter vol. 24, 432201, 7 pages (2012).

\* cited by examiner

Fig.6
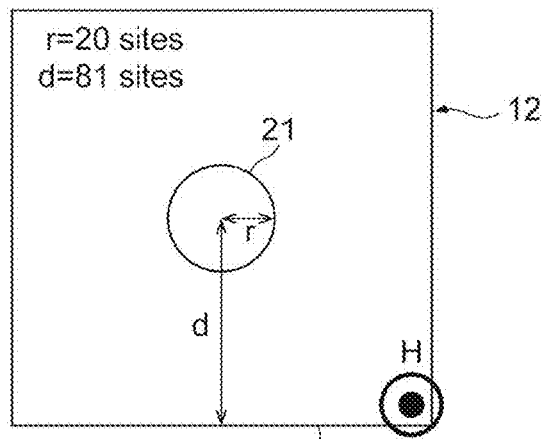
(a)
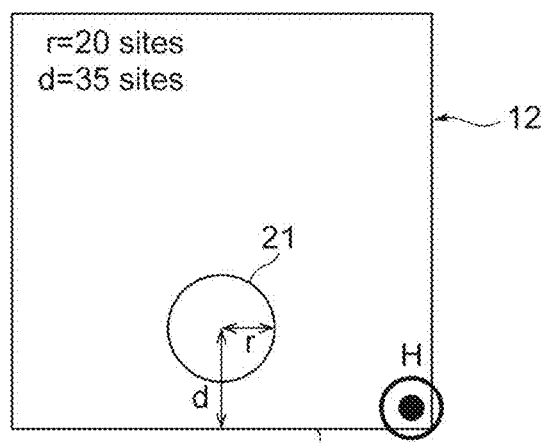
(b)
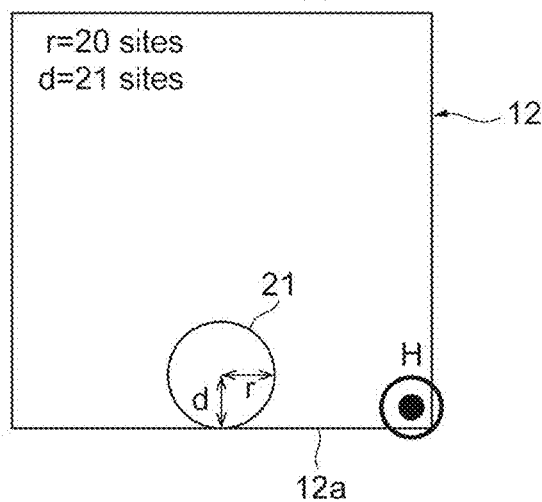
(c)

SKYRMION GENERATION DEVICE, SKYRMION GENERATION METHOD, AND MAGNETIC MEMORY DEVICE

CROSS REFERENCE TO RELATED APPLICATIONS

This patent application is a U.S. national stage application under 35 U.S.C. § 371 of International Patent Application No. PCT/JP2016/057073 filed on Mar. 8, 2016, which claims the benefit of foreign priority to Japanese Patent Application No. JP 2015-072079 filed on Mar. 31, 2015. The International Application was published in Japanese on Oct. 6, 2016, as International Publication No. WO 2016/158230 A1 under PCT Article 21(2).

TECHNICAL FIELD

The present invention relates to a skyrmion generation device, a skyrmion generation method, and a magnetic memory device.

BACKGROUND ART

In Non Patent Document 1, technology for driving skyrmions in a chiral metallic magnetic material by a minute current is disclosed. Further, in Patent Document 1 and Non Patent Document 1, a method of providing a corner (cutout) in a strip-shaped thin film sample made of the chiral metallic magnetic material, causing a current to flow in the sample while applying a magnetic field of predetermined strength, and generating the skyrmions with the corner as a starting point is disclosed.

CITATION LIST

Patent Literature

Patent Document 1: Japanese Patent Application Laid-Open Publication No. 2014-175417

Non Patent Literature

Non Patent Document 1: X Z Yu, N Kanazawa, W Z Zhang, T Nagai, T Hara, K Kimoto, Y Matsui, Y Onose, Y Tokura, "Skyrmion flow near room temperature in an ultralow current density", Nature Communications, 3, 988, 7 Aug. 2012

Non Patent Document 2: Junichi Iwasaki, Masahito Mochizuki, and Naoto Nagaosa, "Current-induced skyrmion dynamics in constricted geometries", Nature Nanotechnology, Volume 8, Pages 742-747, 8 Sep. 2013

SUMMARY OF INVENTION

Technical Problem

A magnetic element using a magnetization structure (electron spin alignment) in a magnetic material as digital information attracts attention as an electronics device having characteristics such as non-volatility and high radiation resistance, and an attempt to operate magnetic information electrically is actively made recently.

Recently, it is confirmed that an external magnetic field is applied to some magnetic materials (for example, MnSi, $Fe_{1-x}Co_xSi$, FeGe, and the like) having a chiral crystal structure without spatial inversion symmetry, and then, skyrmion crystals in which a plurality of skyrmions are aligned in a triangular lattice form are generated in the magnetic materials. FIG. 13 is a perspective view schematically illustrating an alignment of electron spins of one skyrmion, and each arrow in the drawing shows a direction of an electron spin. The skyrmion is formed by aligning a plurality of electron spins in a swirling form, and a magnetization direction in a center portion is anti-parallel to the external magnetic field, and a magnetization direction in a peripheral portion is parallel to the applied external magnetic field.

The skyrmions are characterized by the skyrmion number to be a quantized topological invariant. The skyrmion number is invariant in a continuous change. That is, in a ferromagnetic material, directions of spins are aligned in one direction, however, it is impossible to generate a spin alignment of the skyrmion by continuously changing directions of some spins from such a state. Therefore, a discontinuous change needs to be given to the directions of the spins to generate the spin alignment of the skyrmion, and this is accompanied by a discontinuous change of the skyrmion number. For this reason, if the skyrmion is generated once, the skyrmion has particle stability. The skyrmion has a diameter of about 3 to 100 nm and is extremely small. Therefore, the skyrmion is applied to a magnetic memory device, so that an area necessary for storing unit information can be decreased considerably as compared with a conventional device such as a magnetic bubble memory.

However, in the methods described in Patent Document 1 and Non Patent Document 2, for example, when the skyrmion is generated, a current flows through a metallic magnetic material having resistivity larger than zero. Therefore, Joule heat is generated in the metallic magnetic material. Energy loss due to the generation of the Joule heat increases power consumption of the magnetic memory device using the skyrmion.

The present invention has been made in view of the above problem, and an object thereof is to provide a skyrmion generation device, a skyrmion generation method, and a magnetic memory device capable of reducing power consumption in generating skyrmions.

Solution to Problem

In order to solve the above problem, a skyrmion generation device according to the present invention includes an insulating magnetic body having a skyrmion phase, and an electric field generation unit configured to apply an electric field to the magnetic body to generate a skyrmion in the magnetic body. Further, a skyrmion generation method according to the present invention includes applying an electric field from an electric field generation unit to an insulating magnetic body having a skyrmion phase to generate a skyrmion in the magnetic body.

Conventionally, a metallic magnetic material having a crystal structure called a B20 type, such as MnSi, $Fe_{1-x}Co_xSi$, and FeGe, is known as a chiral magnetic material developing the skyrmions, however, even in an insulating magnetic material (for example, $Cu_2OSeO_3$) having a chiral crystal structure, the skyrmion phase is found. In order to solve the problem described above, the present inventor has found a method of applying the electric field to the insulating magnetic body and generating the skyrmion in the magnetic body. The electric field applied to the insulating magnetic body does not generate Joule heat in the magnetic body. Therefore, power consumption in generating the skyrmions can be reduced, and for example, a power-saving magnetic memory device can be suitably realized.

The skyrmion generation device may further include a magnetic field generation unit configured to apply a magnetic field to the magnetic body. Further, the skyrmion generation method according to the present invention may further include applying a magnetic field to the magnetic body. As a result, the skyrmions can be efficiently generated in the magnetic body.

Further, in the skyrmion generation device and the skyrmion generation method, the magnetic field may be applied to a surface of the magnetic body substantially perpendicularly. Electron spins configuring an outer peripheral portion of the skyrmion and electron spins configuring a center portion of the skyrmion are opposite to each other in directions, and are oriented in a thickness direction of a thin film. Further, the outer peripheral portion of the skyrmion is magnetized in a direction parallel to the magnetic field. Therefore, the magnetic field is applied in a direction substantially perpendicular to the surface of the magnetic body as described above, so that the skyrmion can be efficiently generated.

Further, in the skyrmion generation device, the electric field generation unit may have a needle-shaped electrode and may apply the electric field to the magnetic body locally. Similarly, in the skyrmion generation method, the electric field generation unit may have a needle-shaped electrode and the electric field may be applied from the needle-shaped electrode to the magnetic body locally.

As a method of generating the skyrmions without generating Joule heat in the magnetic body, for example, it is also thought that the magnetic field or the electromagnetic waves are locally applied or radiated to the magnetic body. However, in this method, it is difficult to narrow an application region of the magnetic field or the electromagnetic waves to a degree to which the single skyrmion can be generated. In the case of the electric field, different from the case of the magnetic field or the electromagnetic waves, the application region can be narrowed to a degree to which the single skyrmion can be generated, by using the needle-shaped electrode.

Further, in the skyrmion generation device and the skyrmion generation method, a region of the magnetic body where the electric field is applied may be located in the vicinity of an edge of the magnetic body. As a result, the skyrmion is easily generated by the edge of the magnetic body.

Further, in the skyrmion generation device and the skyrmion generation method, the magnetic body may have a thin film shape with a thickness in a range of 2 to 300 nm at least partially. As such, the magnetic body is formed in a pseudo two-dimensional shape (that is, a thin film shape) having the thickness smaller than a diameter of the generated skyrmion or equal to or smaller than about three times as large as the diameter, and as a result, it is expected that the skyrmions can exist in a wide temperature range, and the skyrmion generation method and the skyrmion generation device can be used at a temperature near a room temperature.

Further, in the skyrmion generation device and the skyrmion generation method, the magnetic body may have a chiral crystal structure.

A magnetic memory device according to the present invention includes an insulating magnetic body having a skyrmion phase and including a plurality of memory areas, and a needle-shaped electrode configured to apply an electric field to the memory area of a writing target locally to generate a skyrmion for holding information in the memory area. According to the magnetic memory device, the configuration of the skyrmion generation device described above is included, so that power consumption in generating the skyrmions can be reduced, and a power-saving magnetic memory device can be suitably realized.

The magnetic memory device may further include a magnetic field generation unit configured to apply a magnetic field to the memory area of the writing target. As a result, the skyrmions can be efficiently generated in the magnetic body.

Advantageous Effects of Invention

According to a skyrmion generation device, a skyrmion generation method, and a magnetic memory device of the present invention, power consumption in generating skyrmions can be reduced.

BRIEF DESCRIPTION OF DRAWINGS

FIG. 6(a) in FIG. 6 to (c) in FIG. 6 are diagrams illustrating a position of an electric field application region with respect to an edge of a magnetic body.

DESCRIPTION OF EMBODIMENTS

Hereinafter, embodiments of the skyrmion generation device, the skyrmion generation method, and the magnetic memory device according to the present invention will be described in detail with reference to the accompanying drawings. In the description of the drawings, the same elements will be denoted with the same reference signs, and overlapped explanation is omitted.

First Embodiment

Figure 1:
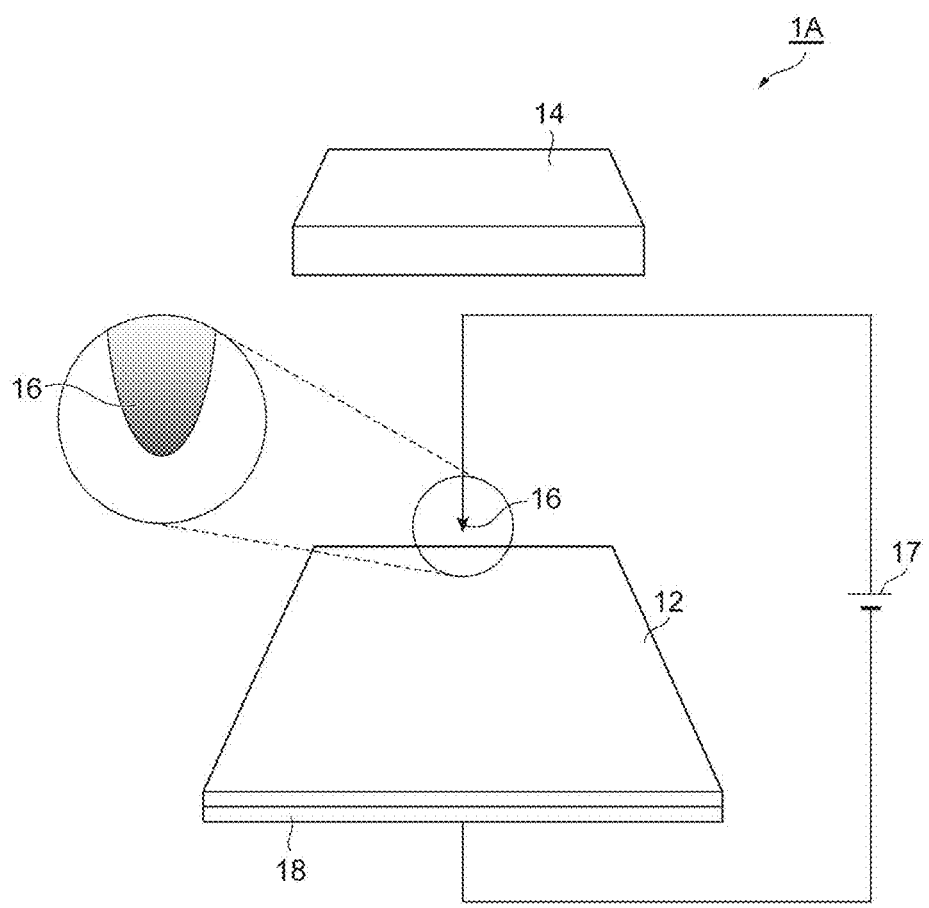
FIG. 1 is a perspective view schematically illustrating a configuration of a skyrmion generation device according to a first embodiment.

FIG. 1 is a perspective view schematically illustrating a configuration of a skyrmion generation device according to a first embodiment of the present invention. As illustrated in FIG. 1, a skyrmion generation device 1A includes a magnetic body 12, a magnetic field generation unit 14, and an electric field generation unit 16.

The magnetic body 12 is an insulating magnetic body having a skyrmion phase. Here, "having the skyrmion phase" means that skyrmions can exist stably on a magnetic phase diagram. As the magnetic body, a chiral magnetic body, that is, a magnetic body in which there is not inversion symmetry in a crystal structure is preferable. As an example of the insulating chiral magnetic body, there is $Cu_2OSeO_3$. In $Cu_2OSeO_3$, it is confirmed that skyrmion crystals in which a plurality of skyrmions are aligned in a triangular lattice form can be generated under conditions of a predetermined magnetic field and temperature.

Stability of the skyrmion depends on a thickness of the magnetic body 12. When the magnetic body 12 has a bulk shape, the skyrmion phase tends to appear in an extremely narrow region on a phase diagram shown by a temperature (T) and a magnetic field (B). On the other hand, when the magnetic body 12 has a thin film shape, the skyrmion phase tends to appear in a wide region on the phase diagram. Therefore, the magnetic body 12 preferably has a thin film shape (pseudo two-dimensional shape) at least partially. As a result, it is expected that the skyrmions can exist in a wide temperature range and the skyrmion generation device 1A according to the present embodiment can be used at a temperature near a room temperature.

Figure 13:
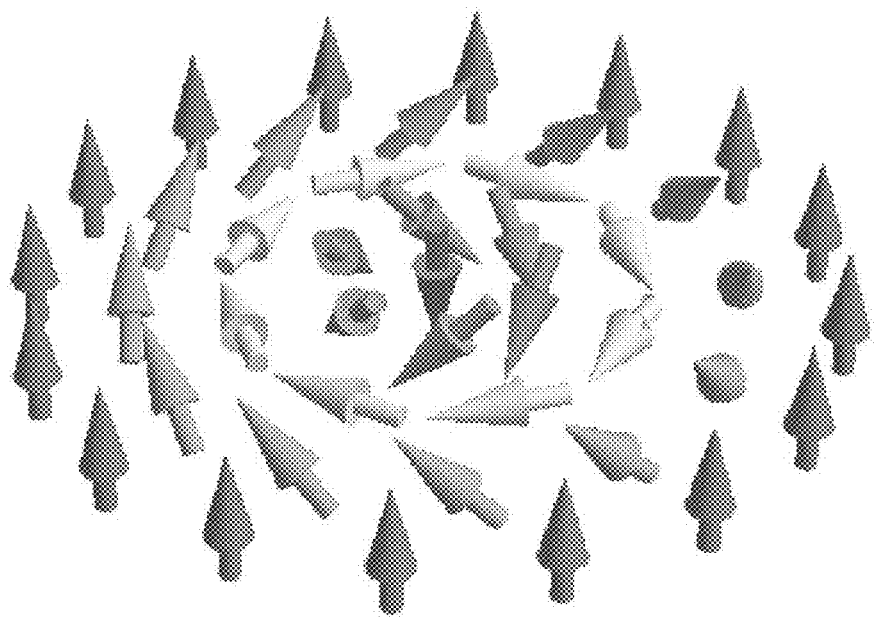
FIG. 13 is a perspective view schematically illustrating an alignment of electron spins of a skyrmion.

In one example, the thickness of the magnetic body 12 may be smaller than a diameter of a swirling spin alignment in the skyrmion illustrated in FIG. 13 or may be equal to or smaller than about three times as large as the diameter. As a result, the two-dimensional behavior of the skyrmion is enabled. Because the diameter of the skyrmion is typically 3 nm to 100 nm, the preferable thickness of the magnetic body 12 is in a range of 2 nm to 300 nm, for example.

Further, the magnetic body 12 may have a thin film shape as a whole, or a part of the magnetic body 12 may have the thin film shape. When the magnetic body 12 has the thin film shape as a whole, the magnetic body 12 may be disposed on a base material 18 for support. Further, when the part of the magnetic body 12 has the thin film shape, the magnetic body 12 may be formed by processing the part of the magnetic body thick as a whole in the thin film shape.

The magnetic field generation unit 14 applies a magnetic field to the magnetic body 12. The magnetic field generation unit 14 applies the magnetic field to a surface of the magnetic body 12 substantially perpendicularly, for example. As illustrated in FIG. 13, electron spins configuring an outer peripheral portion of the skyrmion and electron spins configuring a center portion of the skyrmion are opposite to each other in directions and are oriented in a thickness direction of the magnetic body 12 of the thin film shape. Further, the outer peripheral portion of the skyrmion is magnetized in a direction parallel to the magnetic field. Therefore, the magnetic field is applied in a direction substantially perpendicular to the surface of the magnetic body 12 as described above, so that the skyrmion can be efficiently generated.

The electric field generation unit 16 applies an electric field to the magnetic body 12, so that the skyrmion is generated in the magnetic body 12. In the present embodiment, the electric field generation unit 16 has a needle-shaped electrode and locally applies the electric field to the magnetic body 12. The needle-shaped electrode is disposed to face the surface of the magnetic body 12 and a tip thereof protrudes in a direction perpendicular to the surface of the magnetic body 12. The electric field generation unit 16 is electrically connected to one terminal of a power source 17. Further, the other terminal of the power source 17 is electrically connected to the base material 18 provided at the side of a back surface of the magnetic body 12. The base material 18 is made of a conductive material and configures a lower electrode opposite to the electric field generation unit 16. Therefore, the above-described local electric field penetrates the magnetic body 12 disposed between the electric field generation unit 16 and the base material 18. The electric field is preferably applied to a region of which a diameter is in a range of 10 nm to 100 nm, for example.

Figure 2:
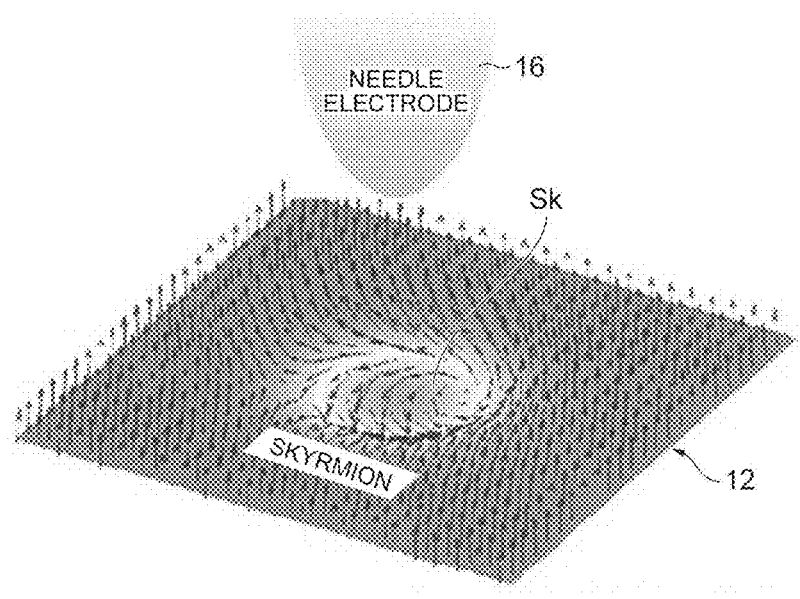
FIG. 2 is a perspective view conceptually illustrating a state of a change of electron spins.

A skyrmion generation method according to the present embodiment using the skyrmion generation device 1A including the configuration described above is as follows. First, the magnetic field of the appropriate strength capable of generating the skyrmion is applied to the magnetic body 12 by the magnetic field generation unit 14. Next, the electric field is locally applied to the magnetic body 12 using the electric field generation unit 16 while the magnetic field is applied. In this case, directions of the electron spins aligned in one direction in the magnetic body 12 are changed by the electric field. FIG. 2 is a perspective view conceptually illustrating a state of the change, and arrows in the drawing show the directions of the electron spins. After inversion of some electron spins occurs, application of the electric field is stopped to relax a magnetization structure so that a single skyrmion Sk in which the electron spins are spatially distributed in a swirling form is generated.

Here, the principle of generation of the skyrmion by the application of the electric field is as follows. When magnetizations configuring the magnetic structure are not parallel or anti-parallel and are adjacent to each other at a finite angle less than 3600 and other than 180°, it is said that the magnetic structure is non-collinear. The skyrmion is typical one of non-collinear magnetic structures. The non-collinear magnetic structure in the insulating magnetic body exhibits electric polarization to be a spatial deviation of an electron distribution, through an interaction in a substance called a spin orbit interaction. Because the electric polarization is strongly coupled to the non-collinear magnetic structure causing the electric polarization, the electric field is applied and an electric polarization alignment is changed, so that the magnetic structure itself is also generated in conjunction with the electric polarization. As such, the skyrmion generation device 1A and the generation method according to the present embodiment use coupling of the skyrmion formed in the insulating magnetic body 12 and the electric polarization. The generation principle is described in detail hereinafter.

For example, the crystal structure and the magnetization structure of $Cu_2OSeO_3$ have a form of a tetrahedron including four $Cu^{2+}$ ions. Further, a collinear spin arrangement in which three spins are up and one spin is down is realized in each tetrahedron. The four spins functioning as a magnetic unit can be treated as a unit magnetization vector $m_i$. A magnetism in $Cu_2OSeO_3$ of a thin film shape can be described by a classical Heisenberg model on a square lattice. Hamiltonian thereof is represented by the following formula (1).

[Formula 1]

$$\mathcal{H}_0 = -J \sum_{\langle i,j \rangle} m_i \cdot m_j - D \sum_{i,\gamma} m_i \times m_{i+\gamma} \cdot \gamma - g\mu_B\mu_0 H_z \sum_i m_{iz}, \quad (1)$$

Here, in the formula (1), g=2 is set and γ shows a unit direction vector corresponding to orthogonal bonds on the square lattice. Further, J shows a coupling constant of the ferromagnetic exchange interaction, D shows a coupling constant of the Dzyaloshinskii-Moriya interaction, $\mu_B$ shows magnetic permeability of $Cu_2OSeO_3$, and $\mu_0$ shows space permeability. In one example, J=1 (meV) and D/J=0.09 are set. The Hamiltonian includes the ferromagnetic exchange interaction, the Dzyaloshinskii-Moriya interaction, and the Zeeman interaction with respect to a static magnetic field H=(0, 0, $H_z$) applied perpendicularly to the surface of the magnetic body.

Figure 3:
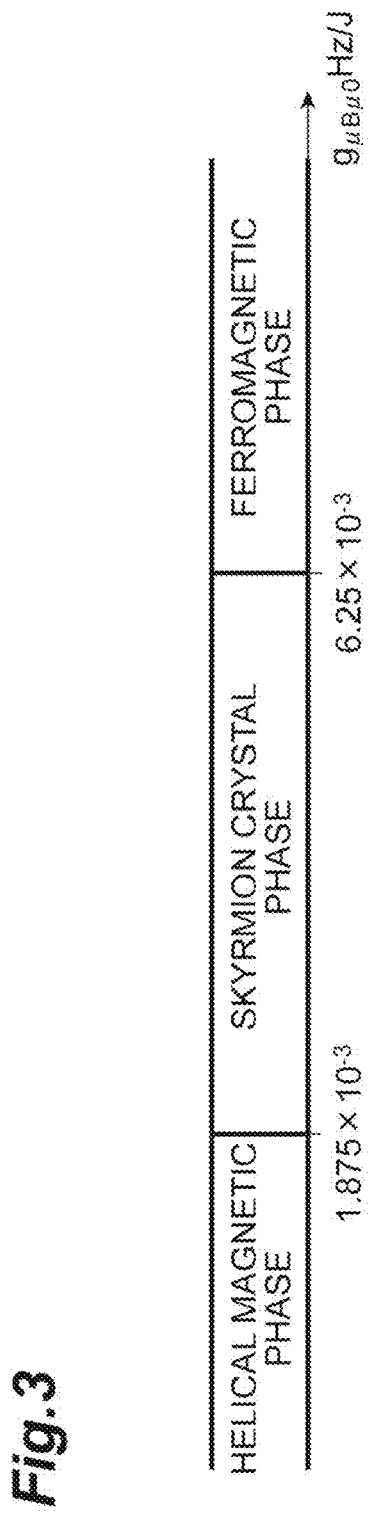
FIG. 3 illustrates a phase diagram of a model of $Cu_2OSeO_3$.

FIG. 3 illustrates a phase diagram of the model. A skyrmion crystal phase emerges in the range of the following formula (2) and is surrounded by a helical and ferromagnetic phase.

[Formula 2]

$$1.875 \times 10^{-3} < |g\mu_B\mu_0 H_z/J| < 6.25 \times 10^{-3} \quad (2)$$

In the skyrmion crystal phase, the skyrmions are aligned and crystallized in a triangular lattice form. At this time, the magnetization vector $m_i$ is parallel to the static magnetic field H at the periphery of each skyrmion and is anti-parallel to the static magnetic field H at the center. When the skyrmion is generated, a phase transition between the skyrmion crystal and the ferromagnetic phase is a most important condition. The skyrmion appears as a phase defect of the ferromagnetic phase as well as a crystal form. Hereinafter, the case in which the electric field from the electric field generation unit 16 is applied to the thin film of the insulating magnetic body in which the magnetization is uniformly aligned ferromagnetically and the isolated skyrmion can be generated is described in detail.

The magnetization structure in the non-collinear skyrmion induces the electric polarization via a spin-dependent metal-ligand hybridization mechanism. Because of the cubic crystal symmetry, an electric polarization vector $p_i$ in an i-th tetrahedron is represented as the following formula (3) using three-dimensional magnetization components $m_{ia}$, $m_{ib}$, and $m_{ic}$.

[Formula 3]

$$p_i = (p_{ia}, p_{ib}, p_{ic}) = \lambda(m_{ib}m_{ic}, m_{ic}m_{ia}, m_{ia}m_{ib}) \quad (3)$$

Here, a value of a constant λ in $Cu_2OSeO_3$ is $5.64 \times 10^{-27}$ (μCm) from the experimental data. A spatial distribution of the electric polarization $p_i$ induced by the magnetization vector $m_i$ forming the skyrmion is calculated from the above formula (3). Further, the spatial distribution of the electric polarization $p_i$ varies depending on a choice of the thin film plane.

Here, the net magnetization vector M and the ferroelectric polarization vector P are given by sums of local contributions represented by the following formulas (4) and (5), respectively.

[Formula 4]

$$M = \frac{g\mu_B}{NV} \sum_{i=1}^{N} \quad (4)$$

[Formula 5]

$$P = \frac{1}{NV} \sum_{i=1}^{N} p_i \quad (5)$$

Here, the index i shows an index of each of tetrahedrons of copper ions having a spin group in which three spins are up and one spin is down, and N shows the total number of tetrahedrons. In addition, V (=$1.76 \times 10^{-28}$ $m^3$) shows a volume of a space occupied by each tetrahedron.

The coupling between magnetism and electricity described above provides an opportunity to generate and operate the skyrmion electrically by adjusting a distribution of the electric polarization. To confirm this, the present inventor has numerically analyzed the Landau-Lifshitz-Gilbert equation using the fourth-order Runge-Kutta method, and thus has performed a numerical dynamic simulation of the magnetization vector $m_i$ and the electric polarization vector $p_i$ in a state in which the electric field is locally applied. This equation is represented by the following formula (6).

[Formula 6]

$$\frac{dm_i}{dt} = -m_i \times H_i^{eff} + \frac{\alpha_G}{m} m_i \times \frac{dm_i}{dt} \quad (6)$$

Here, $\alpha_G$ (=0.04) shows the Gilbert damping coefficient. The effective magnetic field $H_i^{eff}$ is calculated by the following formula (8) from Hamiltonian represented by the following formula (7).

[Formula 7]

$$\mathcal{H} = \mathcal{H}_0 + \mathcal{H}'(t) \quad (7)$$

[Formula 8]

$$H_i^{eff} = -\partial \mathcal{H}/\partial m_i \quad (8)$$

A first term in a right side of the formula (7) shows a model Hamiltonian function (refer to the formula (1) described above). Further, a second term in the right side of the formula (7) shows coupling between the local electric polarization vector $p_i$ and the electric field E. That is, the second term in the right side of the formula (7) is represented by the following formula (9), when it is assumed that the electric field E is applied for a fixed time in a range of a region C.

[Formula 9]

$$\mathcal{H}'(t) = -E(t) \cdot \sum_{i \in C} p_i \quad (9)$$

Figure 4:
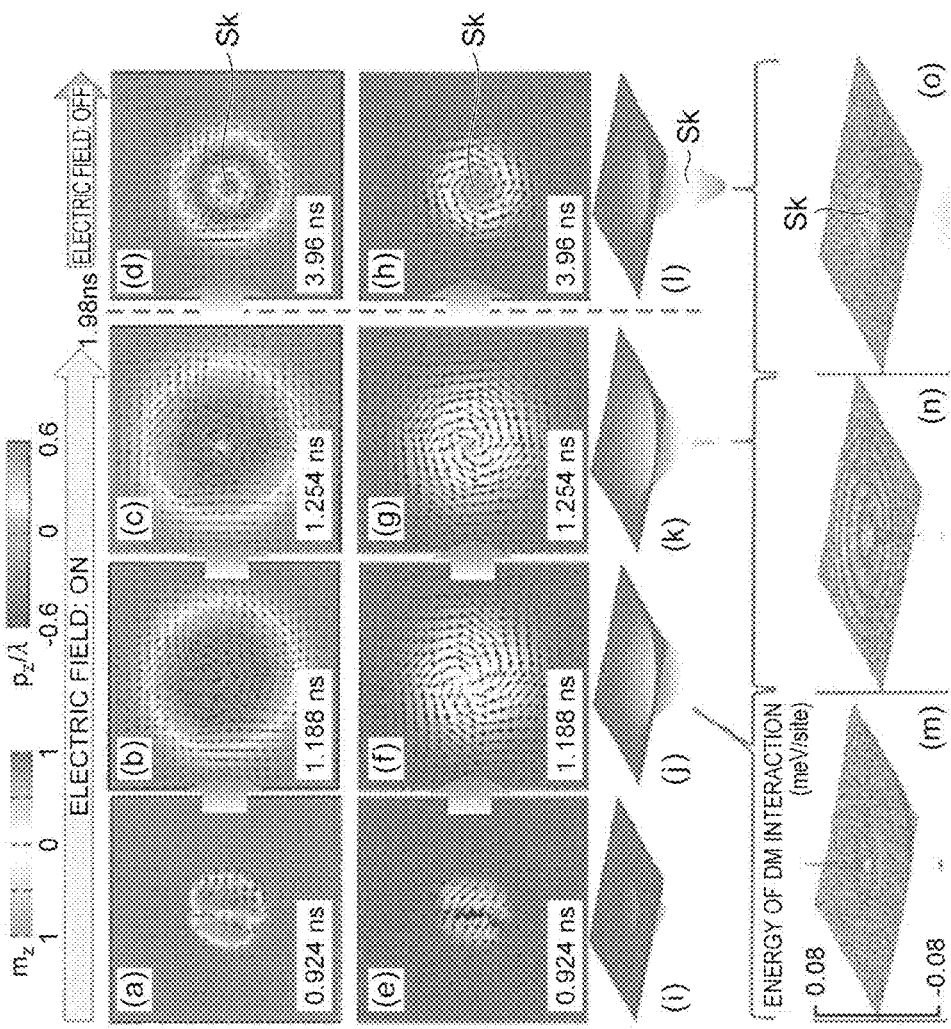
FIG. 4(a) in FIG. 4 to (o) in FIG. 4 are diagrams illustrating simulation results of a magnetization vector and an electric polarization vector in a skyrmion formation process.

According to the simulation by the present inventor, for example, in a thin film sample of the insulating chiral magnetic material with a [111] plane as a surface, the single skyrmion is generated in a ferromagnetic material uniformly magnetized in a magnetic field direction, under the static magnetic field H of a perpendicular direction. (a) in FIG. 4 to (o) in FIG. 4 are diagrams illustrating simulation results of the magnetization vector $m_i$ and the electric polarization vector $p_i$ in the skyrmion formation process. In (a) in FIG. 4 to (d) in FIG. 4, directions of the electric polarization vectors $p_i$ when 0.924 nanoseconds, 1.188 nanoseconds, 1.254 nanoseconds, and 3.96 nanoseconds pass from a start of electric field application are shown by arrows, and change states of $p_z/\lambda$ ($p_z$ is a perpendicular component in the electric polarization vector $p_i$, that is, a component perpendicular to the surface of the magnetic body) are shown by shades of colors. Further, in (e) in FIG. 4 to (h) in FIG. 4, directions of the magnetization vectors $m_i$ when the above-described respective times pass from the start of the electric field application are shown by arrows, and change states of perpendicular components $m_z$ of the magnetization vectors $m_i$ are shown by shades of colors. Further, in (i) in FIG. 4 to (l) in FIG. 4, two-dimensional distributions of the magnetization vectors $m_i$ are shown three-dimensionally, and in (m) in FIG. 4 to (o) in FIG. 4, two-dimensional distributions of energies of the Dzyaloshinskii-Moriya interaction in (j) in FIG. 4 to (l) in FIG. 4 are shown three-dimensionally. Here, in FIG. 4, the electric field is applied to the magnetizations in a circle having a diameter of 40 sites at the center of the sample, and the electric field is turned off when 1.98 nanoseconds pass from the start of the electric field application. Further, in FIG. 4, a perpendicular magnetic field uniformly applied to the magnetic body is set to $g\mu_B\mu_0H_z/J=6.3\times10^{-3}$, and a perpendicular electric field applied to the circle having the diameter of 40 sites at the center of the sample is set to $E_z=-3.98\times10^9$ (V/m) ($E_z$ is a perpendicular component of the electric field E).

The application of the electric field E where the component $E_z$ is negative causes reorientation of the electric polarizations $p_i$ in the electric field application region, as illustrated in (a) to (c) in FIG. 4. Further, as illustrated in (e) to (g) and (i) to (k) in FIG. 4, most of the magnetization vectors $m_i$ in the region rotate to the in-plane direction (that is, a direction along the surface of the magnetic body) from the perpendicular direction, according to the reorientation of the electric polarizations $p_i$. The present inventor has found that inversion of 180° of the local magnetization vector $m_i$ occurs instantly at the center of the electric field application region, between (f) in FIG. 4 and (g) in FIG. 4 and between (j) in FIG. 4 and (k) in FIG. 4. As illustrated in (m) in FIG. 4 to (o) in FIG. 4, the energy of the Dzyaloshinskii-Moriya interaction increases significantly immediately before the magnetization vector $m_i$ is inverted locally and instantly, and decreases significantly immediately after the inversion. These energy changes appear as sharp positive and negative peaks, in (m) in FIG. 4 and (n) in FIG. 4, respectively.

When the inversion of the local magnetization vector $m_i$ occurs once, after turning-off of the electric field E, as illustrated in (d) in FIG. 4, (h) in FIG. 4, (l) in FIG. 4, and (o) in FIG. 4, relaxation of the magnetization arrangement and the reconfiguration are spontaneously generated by relaxation of the spatial distributions of the magnetization vector $m_i$, the electric polarization $p_i$, and the energy of the Dzyaloshinskii-Moriya interaction, and thus, the isolated skyrmion Sk is generated. Whole formation process of the skyrmion structure occurs in extremely short time such as 2 to 3 nanoseconds or less.

In the electrical generation mechanism of the skyrmion described above, the following two facts are important. One is that, when the perpendicular component $m_z$ is dominant in the magnetization vector $m_i$ or the magnetization vector $m_i$ is parallel to the [111] axis, the local electric polarization $p_i$ ($p_z<0$) occurs under the static magnetic field H, and when the in-plane direction component is dominant in the magnetization vector $m_i$ or the magnetization vector $m_i$ is perpendicular to the [111] axis, the local electric polarization $p_i$ ($p_z>0$) occurs under the static magnetic field H. The other is that the Dzyaloshinskii-Moriya interaction (here, D>0) shown in the formula (1) advantageously affects propagation of a clockwise rotation of the magnetization vector $m_i$ (propagation along an arrangement direction (an arrow A1 in (a) in FIG. 5) of the magnetization vector $m_i$).

Figure 5:
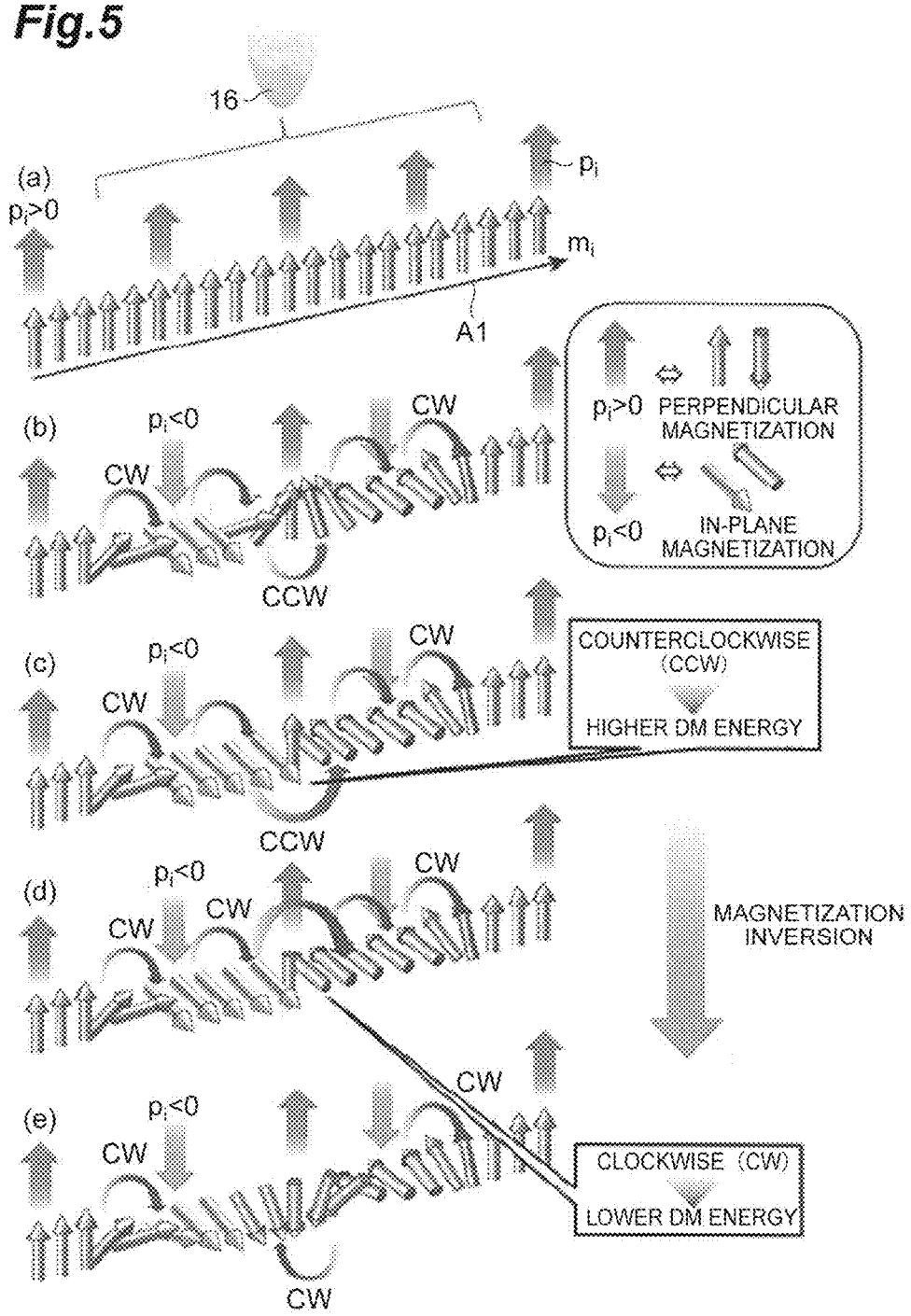
FIG. 5 is a diagram schematically illustrating spatiotemporal dynamics of a magnetization vector and an electric polarization vector aligned and arranged along a diameter direction of an electric field application region.

(a) to (e) in FIG. 5 are diagrams schematically illustrating spatiotemporal dynamics of the magnetization vector $m_i$ and the electric polarization vector $p_i$ aligned and arranged along a diameter direction of the electric field application region. As illustrated in (a) in FIG. 5, in an initial ferromagnetic state in which all magnetization vectors $m_i$ are oriented in the perpendicular direction, all electric polarization vectors $p_i$ are oriented in the perpendicular direction (here, $p_z>0$). Further, when the electric field E of $E_z<0$ is applied, as illustrated in (b) in FIG. 5, according to inversion of the electric polarization vector $p_i$ from the state of $p_z>0$ to the state of $p_z<0$, the magnetization vector $m_i$ rotates to the in-plane direction. At this time, the rotation of the magnetization vector $m_i$ in the vicinity of the peripheral portion of the electric field application region tends to be a clockwise rotation. This is to cause the spatial variation of the magnetization vector $m_i$ to be smoothly connected to the ferromagnetic region outside the electric field application region in the presence of the Dzyaloshinskii-Moriya interaction. On the other hand, the rotation of the magnetization vector $m_i$ in the vicinity of the center of the electric field application region inevitably becomes a counterclockwise rotation, as illustrated in (c) in FIG. 5. However, this is an unfavorable change with respect to the Dzyaloshinskii-Moriya interaction. Further, when the magnetization vector $m_i$ is oriented in the in-plane direction in a region of $E_z<0$ and $p_z<0$, the magnetization vector $m_i$ rotates very rapidly in the counterclockwise direction. This magnetization arrangement causes large loss of the energy of the Dzyaloshinskii-Moriya interaction with the sharp positive peak illustrated in (m) in FIG. 4. In order to eliminate an unstable energy alignment of the magnetization vector $m_i$, the center magnetization vector $m_i$ is finally inverted from the state of $m_z>0$ to the state of $m_z<0$, as illustrated in (d) in FIG. 5. By the instant inversion of the local magnetization vector $m_i$, the magnetization vector $m_i$ located at the center of the electric field application region acquires large gain of the energy of the Dzyaloshinskii-Moriya interaction with the sharp negative peak illustrated in (n) in FIG. 4. The magnetization vector $m_i$ inverted locally as described above becomes a core of the skyrmion. As illustrated in (l) in FIG. 4 and (o) in FIG. 4, even after the electric field E is turned off, the alignment of the magnetization vector $m_i$ maintains a spin structure of the skyrmion.

Here, the strength of the electric field E necessary for generating the skyrmion is different according to the electric field application position in the magnetic body. For example, when the electric field is applied to the vicinity of the edge of the magnetic body, the strength of the electric field necessary for generating the skyrmion can be suppressed as compared with other cases. When the electric field is applied to a position far from the edge of the magnetic body, the large energy is consumed to invert the magnetization vector $m_i$ locally. On the other hand, when the electric field is applied to a position close to the edge of the magnetic body, the magnetization vector $m_i$ can be inverted locally by the relatively small energy. The reasons are that the number of spins to be rotated is small at the position close to the edge of the magnetic body, and that a distribution of the magnetization is discontinuous at the edge of the magnetic body, a continuous change of a phase invariant is enabled therethrough, and a topological restriction is relaxed.

(a) in FIG. 6 to (c) in FIG. 6 are diagrams illustrating positions of the electric field application region 21 with respect to the edge 12a of the magnetic body 12 and illustrate the case ((a) in FIG. 6) in which a distance d between the electric field application region 21 having a radius r of 20 sites and the edge 12a is 81 sites, the case ((b) in FIG. 6) in which the distance d is 35 sites, and the case ((c) in FIG. 6) in which the distance d is 21 sites (that is, the case in which the electric field application region 21 almost contacts the edge 12a), respectively. Further, FIG. 7 is a graph illustrating a relation between the electric field strength and the number of skyrmions generated in each of the cases illustrated in (a) in FIG. 6 to (c) in FIG. 6, and a graph G11 corresponds to (a) in FIG. 6, a graph G12 corresponds to (b) in FIG. 6, and a graph G13 corresponds to (c) in FIG. 6.

Figure 7:
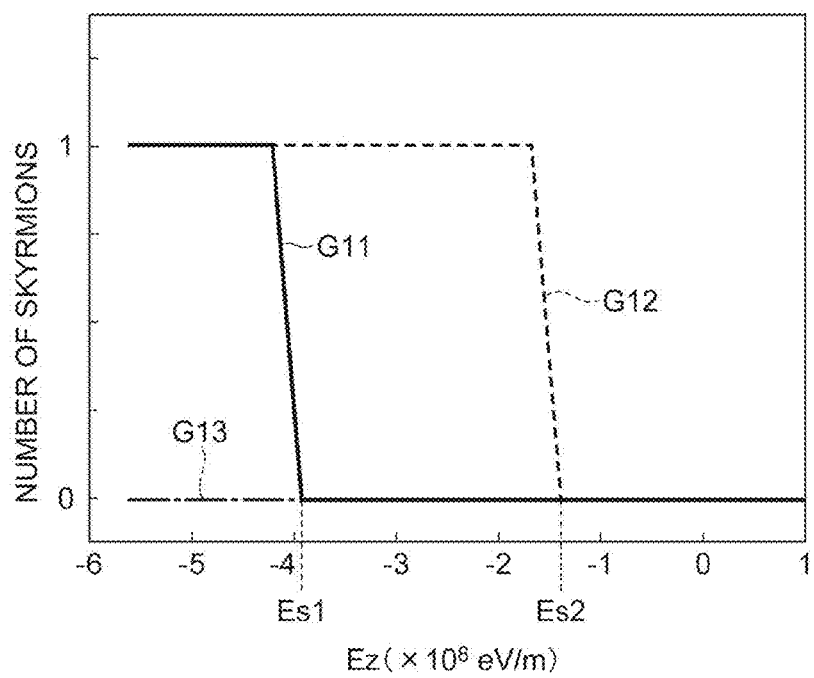
FIG. 7 is a graph illustrating a relation between the electric field strength and the number of skyrmions generated.

As shown by the graph G11 in FIG. 7, when the electric field application region 21 is far from the edge 12a of the magnetic body 12, an absolute value of a threshold Es1 of the electric field to generate the skyrmion becomes a large value (for example, $4.0 \times 10^8$ (eV/m)). On the other hand, as shown by the graph G12 in FIG. 7, when the electric field application region 21 is close to the edge 12a of the magnetic body 12, an absolute value of a threshold Es2 of the electric field to generate the skyrmion becomes a significantly small value (for example, $1.4 \times 10^8$ (eV/m)).

Figure 8:
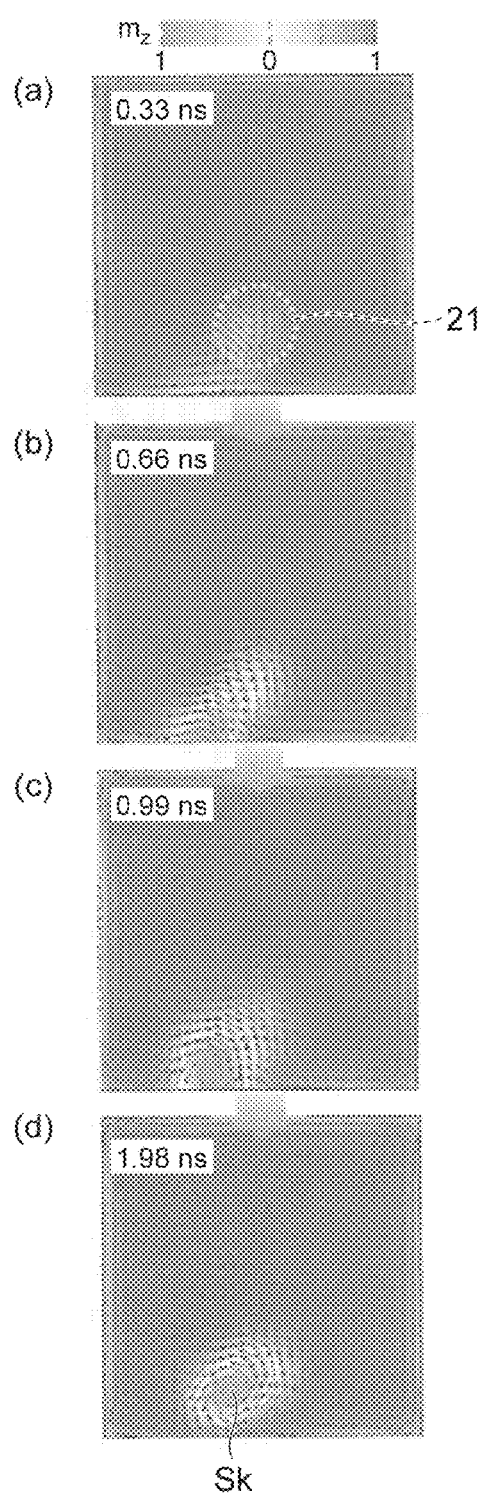
FIG. 8(a) in FIG. 8 to (d) in FIG. 8 are diagrams schematically illustrating a skyrmion generation process.

FIG. 8 is a diagram schematically illustrating a skyrmion generation process in the case in which the position of the electric field application region 21 is set as in (b) in FIG. 6. When 0.33 nanoseconds pass after the application of the electric field starts, the magnetization vector $m_i$ starts rotation ((a) in FIG. 8). Here, a dashed line in the drawing shows the electric field application region 21. Next, when 0.66 nanoseconds pass after the application of the electric field starts, the magnetization vector $m_i$ is inverted at the edge 12a of the magnetic body 12 and a seed of the skyrmion is generated ((b) in FIG. 8). Subsequently, when 0.99 nanoseconds pass after the application of the electric field starts, the seed of the skyrmion moves to the electric field application region 21 ((c) in FIG. 8). Then, when 1.98 nanoseconds pass after the application of the electric field starts, the skyrmion Sk is stably maintained in the electric field application region 21 ((d) in FIG. 8). As such, when the electric field application region 21 is located in the vicinity of the edge 12a, the skyrmion is easily generated by the edge 12a.

Here, as shown by the graph G13 in FIG. 7, when the electric field application region 21 almost contacts the edge 12a of the magnetic body 12, the skyrmion is not generated. In this case, the magnetization vector $m_i$ is inverted by the extremely weak electric field, however, immediately after the electric field is turned off, the seed of the skyrmion is absorbed by the edge 12a and disappears.

From the above result, a distance between the center (tip of the needle-shaped electrode) of the electric field generation unit 16 and the edge 12a of the magnetic body 12 in the present embodiment when viewed from a direction perpendicular to the surface of the magnetic body 12 is preferably included in a range of 20 nm to 40 nm.

Figure 9:
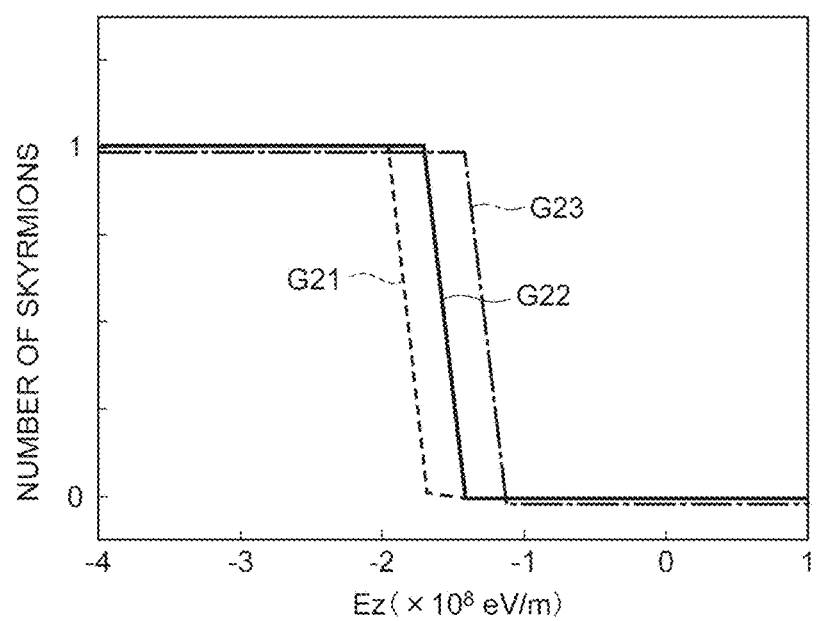
FIG. 9 is a graph illustrating a relation between the electric field strength and the number of skyrmions generated when the magnitude of an external magnetic field is changed.

The strength of the electric field necessary for generating the skyrmion is different according to the strength of the external magnetic field, for example, as well as the position of the electric field application region 21. FIG. 9 is a graph illustrating a relation between the electric field strength and the number of skyrmions generated when the magnitude of the external magnetic field is changed in the vicinity of a critical magnetic field ($g\mu_B\mu_0 H_z/J=6.25 \times 10^{-3}$) of the skyrmion crystal phase and the ferromagnetic phase, and a graph G21 shows the case in which $g\mu_B\mu_0 H_z/J=6.5 \times 10^{-3}$, a graph G22 shows the case in which $g\mu_B\mu_0 H_z/J=6.3 \times 10^{-3}$, and a graph G23 shows the case in which $g\mu_B\mu_0 H_z/J=5.7 \times 10^{-3}$. In this case, a threshold of the electric field becomes $1.7 \times 10^8$ (eV/m) in the graph G21, $1.4 \times 10^8$ (eV/m) in the graph G22, and $1.1 \times 10^8$ (eV/m) in the graph G23, and in the vicinity of a phase boundary of the skyrmion crystal phase and the ferromagnetic phase, when the external magnetic field $H_z$ is small, the strength of the electric field necessary for generating the skyrmion decreases.

Effects obtained by the skyrmion generation device and the skyrmion generation method according to the present embodiment described above are described. Different from a method of generating the skyrmion by causing a current to flow to the magnetic material, in the present embodiment, the skyrmion is generated by applying the electric field to the insulating magnetic body 12. The electric field applied to the insulating magnetic body 12 does not generate Joule heat in the magnetic body 12. Therefore, power consumption in generating the skyrmion can be reduced, and for example, a power-saving magnetic memory device can be suitably realized.

Further, as in the present embodiment, the electric field generation unit 16 may have the needle-shaped electrode, and the electric field may be locally applied from the needle-shaped electrode to the magnetic body 12. As a method of generating the skyrmion without generating the Joule heat in the magnetic body 12, it is also thought that the magnetic field or the electromagnetic waves are locally applied or radiated to the magnetic body 12, for example. However, in this method, it is difficult to narrow an application region of the magnetic field or the electromagnetic waves to a degree to which the single skyrmion can be generated. In the case of the electric field, different from the case of the magnetic field or the electromagnetic waves described above, the application region can be narrowed to a degree to which the single skyrmion can be generated, by using the needle-shaped electrode.

(First Modification)

In the above embodiment, the simulation is performed by applying the perpendicular magnetic field ($g\mu_B\mu_0 H_z/J=6.3 \times 10^{-3}$) of the strength to be the ferromagnetic phase to the magnetic body (refer to FIG. 4), however, even in a state in which the perpendicular magnetic field of the strength to be a helical magnetic phase is applied, the skyrmion can be suitably generated. That is, according to the simulation of this modification, the single skyrmion can be generated in the helical magnetic state realized when the static magnetic field H applied in the perpendicular direction is weak, as well as the ferromagnetic state realized when the static magnetic field H applied in the perpendicular direction is strong, in the thin film sample of the insulating chiral magnetic material with a [001] plane as a surface, for example.

Figure 10:
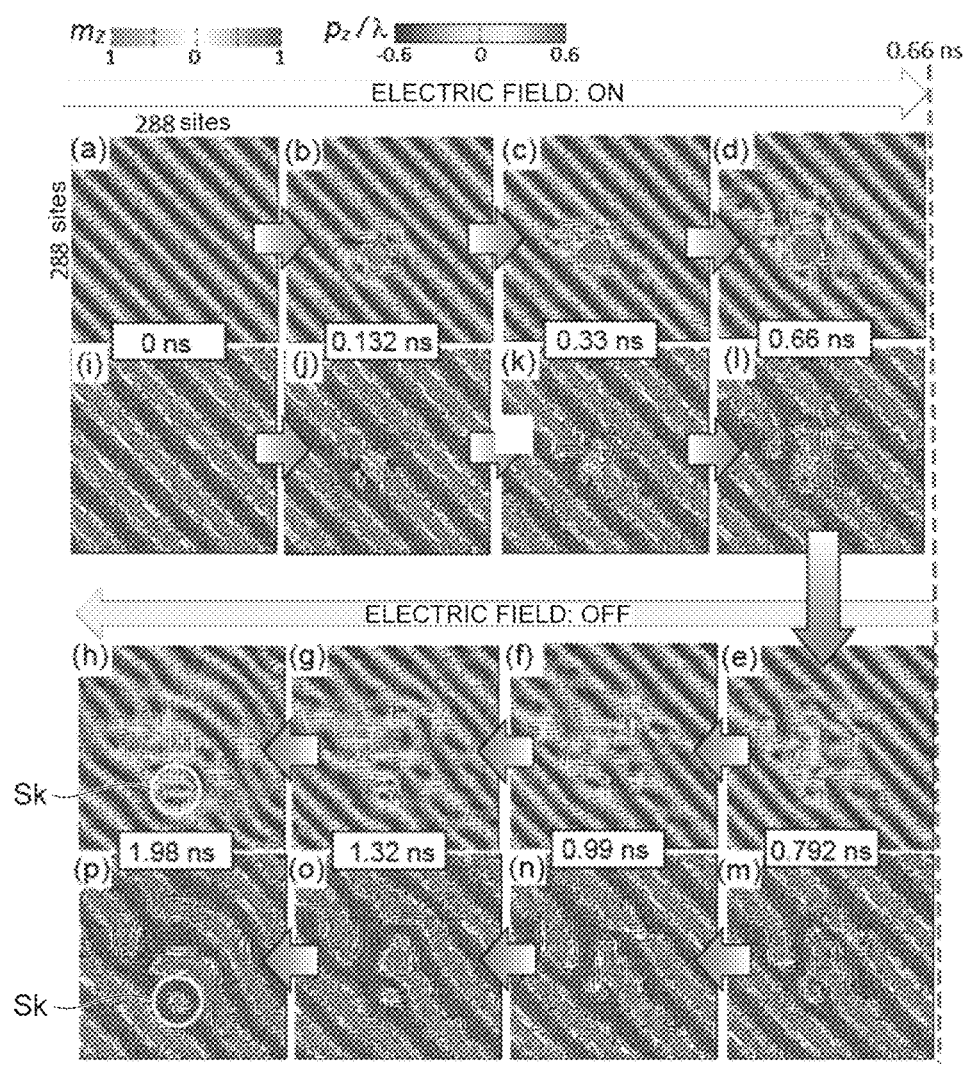
FIG. 10(a) in FIG. 10 to (p) in FIG. 10 are diagrams illustrating simulation results of a magnetization vector and an electric polarization vector in a skyrmion formation process.

In (a) in FIG. 10 to (h) in FIG. 10, directions of the electric polarizations $p_i$ immediately after the application of the electric field starts (when 0 nanosecond passes) and when 0.132 nanoseconds, 0.33 nanoseconds, 0.66 nanoseconds, 0.792 nanoseconds, 0.99 nanoseconds, 1.32 nanoseconds, and 1.98 nanoseconds pass from the start of the electric field application are shown by arrows, and change states of $p_x/\lambda$ ($p_x$ is a perpendicular component in the electric polarization vector $p_i$) are shown by shades of colors. Further, in (i) in FIG. 10 to (p) in FIG. 10, directions of the magnetization vectors $m_i$ when the above-described respective times pass from the start of the electric field application are shown by arrows, and change states of the perpendicular components $m_z$ of the magnetization vectors $m_i$ are shown by shades of colors. Here, in FIG. 10, the electric field is applied to the magnetizations in a circle having a diameter of 40 sites in the vicinity of the center of the sample, and the electric field is turned off when 0.66 nanoseconds pass from the start of the electric field application. Further, in FIG. 10, the perpendicular magnetic field uniformly applied to the sample is set to $g\mu_B\mu_0 H_z/J=1.875\times10^{-3}$, and the perpendicular electric field applied to the circle having the diameter of 40 sites at the center of the sample is set to $E_z=+3.98\times10^9$ (V/m).

The application of the electric field E where the component $E_z$ is positive causes reorientation of the electric polarizations $p_i$ in the electric field application region, as illustrated in (a) to (d) in FIG. 10. Further, as illustrated in (i) to (l) in FIG. 10, most of the magnetization vectors $m_i$ in the region rotate to the in-plane direction (that is, a direction along the surface of the magnetic body) from the perpendicular direction, according to the reorientation of the electric polarizations $p_i$. Further, inversion of 180° of the local magnetization vector $m_i$ instantly occurs at the center of the electric field application region. When the inversion of the local magnetization vector $m_i$ occurs once, after turning-off of the electric field E, as illustrated in (e) to (h) in FIG. 10 and (m) to (p) in FIG. 10, relaxation of the magnetization arrangement and the reconfiguration are spontaneously generated by relaxation of the spatial distributions of the magnetization vector $m_i$ and the electric polarization $p_i$, and thus, the isolated skyrmion Sk is generated.

(Second Modification)

Figure 11:
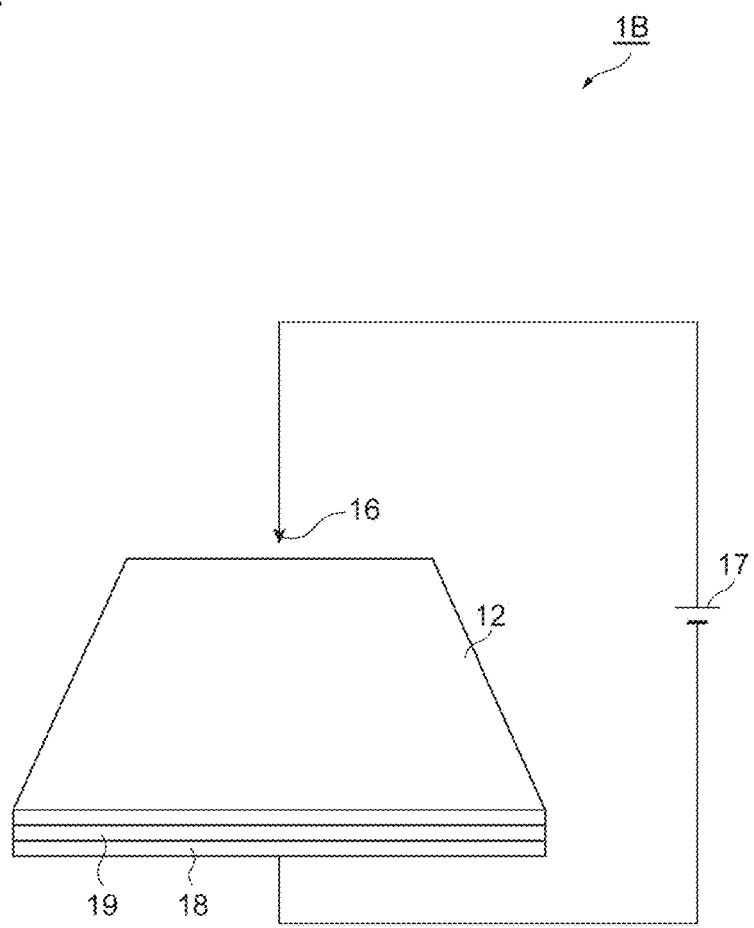
FIG. 11 is a diagram illustrating a second modification.

In the above embodiment, the example of the case in which the magnetic field generation unit 14 is disposed at a distance at a position facing the surface of the magnetic body 12 is illustrated, however, the arrangement of the magnetic field generation unit is not limited thereto. For example, as in a skyrmion generation device 1B illustrated in FIG. 11, even when a ferromagnetic layer 19 functioning as a magnetic field generation unit is attached to the rear surface (or the front surface) of the magnetic body 12, the magnetic field can be suitably applied to the magnetic body 12. In this case, the ferromagnetic layer 19 may be, for example, disposed between the rear surface of the magnetic body 12 and the conductive base material 18. By this configuration also, the skyrmion can be efficiently generated.

(Third Modification)

In the above embodiment, the example of the case in which the magnetic field generation unit 14 applies the magnetic field to the magnetic body 12 is illustrated, however, the magnetic field generation unit can be omitted. For example, it is thought that the magnetic body 12 is configured by a material having strong magnetic anisotropy, for example, a magnetic body having strong magnetic anisotropy such as a chiral magnetic body, and the skyrmion can be generated by only the electric field from the electric field generation unit 16, without applying the magnetic field.

Second Embodiment

Figure 12:
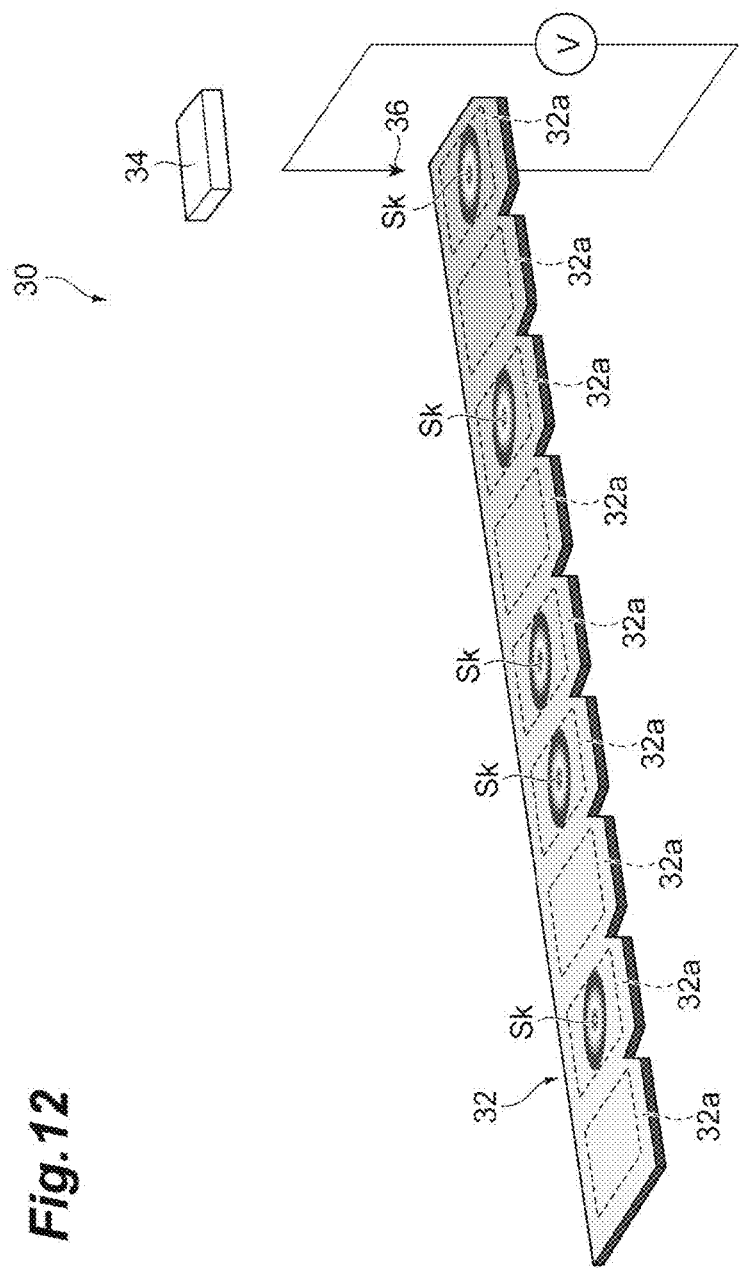
FIG. 12 is a diagram schematically illustrating a configuration of a magnetic memory device according to a second embodiment.

Next, a configuration of a magnetic memory device using the skyrmion generation method according to the above embodiment is described. FIG. 12 is a diagram schematically illustrating a configuration of a magnetic memory device 30 according to the present embodiment. As illustrated in FIG. 12, the magnetic memory device 30 includes a magnetic body 32, a magnetic field generation unit 34, and an electric field generation unit 36.

Similar to the magnetic body 12 in the first embodiment, the magnetic body 32 is an insulating magnetic body having a skyrmion phase. In addition, the magnetic body 32 of the present embodiment includes a plurality of memory areas 32a that are arranged in a predetermined direction. When a single skyrmion is formed in each memory area 32a, information of one bit is written to the memory area and is held therein. The magnetic field generation unit 34 applies a magnetic field (external magnetic field) to the memory area 32a of a writing target. The magnetic field applied by the magnetic field generation unit 34 is the same as the magnetic field described in the first embodiment. The electric field generation unit 36 applies an electric field to the memory area 32a of the writing target and generates the skyrmion Sk for holding information in the memory area 32a. The electric field generation unit 36 has a needle-shaped electrode, for example, and applies the electric field to the memory area 32a locally. The generated skyrmion Sk can move to a predetermined position using an electric field gradient or a temperature gradient, for example.

Further, as methods of reading the skyrmion Sk, there are a method of forming the magnetic body 32 in a Hall bar type and reading the skyrmion Sk using a Hall effect, and a method of reading the skyrmion using a tunnel magnetoresistance effect.

According to the magnetic memory device 30 of the present embodiment, the configuration of the skyrmion generation device 1A according to the first embodiment is included, so that power consumption in generating the skyrmion can be reduced, and a power-saving magnetic memory device can be suitably realized.

The skyrmion generation device, the skyrmion generation method, and the magnetic memory device according to the present invention are not limited to the embodiments described above, and various modifications can be made. For example, according to the skyrmion generation method and the skyrmion generation device described above, the skyrmion can be erased. That is, the electric field of the direction opposite to the direction of the electric field when the skyrmion is generated is applied to the skyrmion by the needle-shaped electrode and re-inversion of the magnetization vector is generated by an action opposite to an action when the skyrmion is generated, so that the skyrmion can be erased. Further, in the skyrmion generation method described above, the electric field is applied to the magnetic body after the application of the magnetic field starts, however, even when the magnetic field is applied after the application of the electric field starts, the skyrmion can be suitably formed.

INDUSTRIAL APPLICABILITY

The present invention can be used as a skyrmion generation device, a skyrmion generation method, and a magnetic memory device capable of reducing power consumption in generating skyrmions. In particular, according to the present invention, the skyrmion can be generated only by applying an electric field. The skyrmion has high stability, and can be moved easily using the electric field gradient or the temperature gradient. Therefore, the present invention is applicable to a memory device in which an information memory density is high and power consumption is low.

REFERENCE SIGNS LIST

1A—skyrmion generation device, 12—magnetic body, 14—magnetic field generation unit, 16—electric field generation unit, 17—power source, 18—base material, 19—ferromagnetic layer, 21—electric field application region, 30—magnetic memory device, 32—magnetic body, 32a—memory area, 34—magnetic field generation unit, 36—electric field generation unit.

The invention claimed is:

1. A skyrmion generation device comprising:
an insulating magnetic body configured to have a skyrmion phase; and
an electric field generation unit configured to apply an electric field to the insulating magnetic body to generate a skyrmion in the insulating magnetic body,
wherein the electric field applied to the insulating magnetic body does not generate Joule heat in the insulating magnetic body.

2. The skyrmion generation device according to claim 1, further comprising a magnetic field generation unit configured to apply a magnetic field to the insulating magnetic body.

3. The skyrmion generation device according to claim 2, wherein the magnetic field generation unit applies the magnetic field to a surface of the insulating magnetic body substantially perpendicularly.

4. The skyrmion generation device according to claim 1, wherein the electric field generation unit has a needle-shaped electrode and applies the electric field to the insulating magnetic body locally.

5. The skyrmion generation device according to claim 1, wherein a region of the insulating magnetic body where the electric field is applied is located in the vicinity of an edge of the insulating magnetic body.

6. The skyrmion generation device according to claim 1, wherein the insulating magnetic body has a thin film shape with a thickness in a range of 2 nm to 300 nm at least partially.

7. The skyrmion generation device according to claim 1, wherein the insulating magnetic body has a chiral crystal structure.

8. A skyrmion generation method, comprising:
applying an electric field from an electric field generation unit to an insulating magnetic body, which is configured to have a skyrmion phase, to generate a skyrmion in the insulating magnetic body, wherein the electric field applied to the insulating magnetic body does not generate Joule heat in the insulating magnetic body.

9. The skyrmion generation method according to claim 8, further comprising applying a magnetic field to the insulating magnetic body.

10. The skyrmion generation method according to claim 9, wherein the magnetic field is applied to a surface of the insulating magnetic body substantially perpendicularly.

11. The skyrmion generation method according to claim 8, wherein the electric field generation unit has a needle-shaped electrode and the electric field is applied from the needle-shaped electrode to the insulating magnetic body locally.

12. The skyrmion generation method according to claim 8, wherein a region of the insulating magnetic body where the electric field is applied is located in the vicinity of an edge of the insulating magnetic body.

13. The skyrmion generation method according to claim 8, wherein the insulating magnetic body has a thin film shape with a thickness in a range of 2 nm to 300 nm at least partially.

14. The skyrmion generation method according to claim 8, wherein the insulating magnetic body has a chiral crystal structure.

15. A magnetic memory device comprising:
an insulating magnetic body configured to have a skyrmion phase, the insulating magnetic body comprising a plurality of memory areas; and
an electric field generation unit configured to apply an electric field to the memory area of a writing target to generate a skyrmion for holding information in the memory area,
wherein the electric field applied to the insulating magnetic body does not generate Joule heat in the insulating magnetic body.

16. The magnetic memory device according to claim 15, further comprising a magnetic field generation unit configured to apply a magnetic field to the memory area of the writing target.

17. The skyrmion generation device according to claim 2, wherein the electric field generation unit has a needle-shaped electrode and applies the electric field to the insulating magnetic body locally.

18. The skyrmion generation device according to claim 2, wherein a region of the insulating magnetic body where the electric field is applied is located in the vicinity of an edge of the insulating magnetic body.

19. The skyrmion generation method according to claim 9, wherein the electric field generation unit has a needle-shaped electrode and the electric field is applied from the needle-shaped electrode to the insulating magnetic body locally.

20. The skyrmion generation method according to claim 9, wherein a region of the insulating magnetic body where the electric field is applied is located in the vicinity of an edge of the insulating magnetic body.

* * * * *